US011923851B2

(12) United States Patent
Sakano et al.

(10) Patent No.: US 11,923,851 B2
(45) Date of Patent: Mar. 5, 2024

(54) DRIVE DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsunori Sakano, Shinagawa (JP); Ryohei Gejo, Kawasaki (JP); Tomoko Matsudai, Shibuya (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/812,021

(22) Filed: Jul. 12, 2022

(65) Prior Publication Data
US 2023/0238944 A1    Jul. 27, 2023

(30) Foreign Application Priority Data

Jan. 21, 2022    (JP) .................................. 2022-007651

(51) Int. Cl.
*H03K 3/012*    (2006.01)
*H03K 17/56*    (2006.01)

(52) U.S. Cl.
CPC ............. *H03K 3/012* (2013.01); *H03K 17/56* (2013.01)

(58) Field of Classification Search
CPC ...... H03K 3/012; H03K 17/56; H03K 17/122; H03K 17/166; H03K 17/063; H03K 17/16;
(Continued)

(56) References Cited

U.S. PATENT DOCUMENTS

2018/0183433 A1*    6/2018    Ojima .............. H03K 17/04206
2018/0191239 A1*    7/2018    Hokazono ............... H02M 1/08
(Continued)

FOREIGN PATENT DOCUMENTS

EP    3 764 533 A1    1/2021
JP    2019-145758 A    8/2019
(Continued)

*Primary Examiner* — Lincoln D Donovan
*Assistant Examiner* — Tyler J Pereny
(74) *Attorney, Agent, or Firm* — Oblon, McClelland, Maier & Neustadt, L.L.P.

(57) ABSTRACT

According to one embodiment, a drive device includes a drive circuit configured to drive a semiconductor device. The semiconductor device includes first to fourth electrodes, a semiconductor member, and an insulating member. The semiconductor member includes first to fourth semiconductor region. The first semiconductor region includes first to third partial regions. The first semiconductor region is between the first electrode and the second semiconductor region. The third semiconductor region is between the first and second semiconductor regions. The fourth semiconductor region is between the first electrode and the first semiconductor region. The second electrode is electrically connected to the second semiconductor region. The first partial region is between the fourth semiconductor region and the third electrode. The second partial region is between the fourth semiconductor region and the fourth electrode. A part of the insulating member is provided between the semiconductor member and the third and fourth electrodes.

20 Claims, 12 Drawing Sheets

(58) Field of Classification Search
CPC ............ H03K 17/127; H03K 17/0822; H03K 17/0412; H03K 3/013; H03K 17/687; H03K 17/04206; H03K 17/0828; H03K 17/567; H03K 17/168; H03K 2217/0036; H01L 29/1608; H01L 29/66068; H01L 29/1095; H01L 29/7813; H01L 29/41766; H01L 29/0696; H01L 29/0623; H01L 29/0878; H01L 29/7802; H01L 29/7806; H01L 29/0619; H01L 29/41741; H01L 21/049; H01L 29/45; H01L 29/66734; H01L 29/7811; H01L 29/7805; H01L 29/7395; H01L 29/6606; H01L 21/02236; H01L 29/7827; H01L 29/66666; H01L 29/0611; H02M 7/537
See application file for complete search history.

(56) References Cited

U.S. PATENT DOCUMENTS

| | | | |
|---|---|---|---|
| 2020/0083879 A1 | 3/2020 | Tanaka et al. | |
| 2020/0091911 A1* | 3/2020 | Iwamizu | ................. H01L 29/45 |
| 2020/0303525 A1* | 9/2020 | Iwakaji | ............... H01L 29/4236 |
| 2020/0321959 A1* | 10/2020 | Bhat | ................... H01L 29/1608 |
| 2021/0091217 A1 | 3/2021 | Miyoshi et al. | |

FOREIGN PATENT DOCUMENTS

| | | |
|---|---|---|
| JP | 2019-161720 A | 9/2019 |
| JP | 6656414 B2 | 3/2020 |

* cited by examiner

DRIVE DEVICE AND SEMICONDUCTOR MODULE

CROSS-REFERENCE TO RELATED APPLICATIONS

This application is based upon and claims the benefit of priority from Japanese Patent Application No. 2022-007651, filed on Jan. 21, 2022; the entire contents of which are incorporated herein by reference.

FIELD

Embodiments of the invention generally relate to a drive device and a semiconductor module.

BACKGROUND

For example, a semiconductor device such as an IGBT (insulated gate bipolar transistor) is used in a power conversion circuit or the like. A drive device and a semiconductor module capable of suppressing loss in a semiconductor device are desired.

DETAILED DESCRIPTION

Figure 1A:
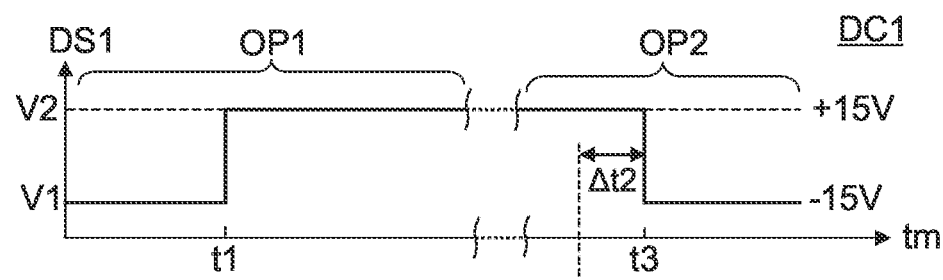
FIGS. 1A and 1B are schematic diagrams illustrating an operation of a drive device and a semiconductor module according to a first embodiment.

According to one embodiment, a drive device includes a drive circuit configured to drive a semiconductor device. The semiconductor device includes a first electrode, a second electrode, a third electrode, a fourth electrode, a semiconductor member, and an insulating member. The semiconductor member includes a first semiconductor region of a first conductive type, a second semiconductor region of the first conductive type, a third semiconductor region of a second conductive type, and a fourth semiconductor region of the second conductive type. The first semiconductor region includes a first partial region, a second partial region, and a third partial region. The first semiconductor region is located between the first electrode and the second semiconductor region in a first direction. The third semiconductor region is located between the first semiconductor region and the second semiconductor region in the first direction. The fourth semiconductor region is located between the first electrode and the first semiconductor region in the first direction. The second electrode is electrically connected to the second semiconductor region. The first partial region is located between the fourth semiconductor region and the third electrode in the first direction. A second direction from the third electrode to the fourth electrode crosses the first direction. The second partial region is located between the fourth semiconductor region and the fourth electrode in the first direction. At least a part of the third partial region is located between the third electrode and the fourth electrode. At least a part of the second semiconductor region and at least a part of the third semiconductor region are located between the third electrode and the fourth electrode in the second direction. At least a part of the insulating member is provided between the semiconductor member and the third electrode, and between the semiconductor member and the fourth electrode. The drive circuit is configured to supply a first drive signal to the third electrode and to supply a second drive signal to the fourth electrode. In a first operation, the first drive signal is configured to change from a first potential to a second potential higher than the first potential. In the first operation, the second drive signal is configured to change from a third potential to a fourth potential higher than the third potential, and to change to a fifth potential between the third potential and the fourth potential after the changing from the third potential to the fourth potential.

According to one embodiment, a semiconductor module includes the drive device described above, and the semiconductor device.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1B:
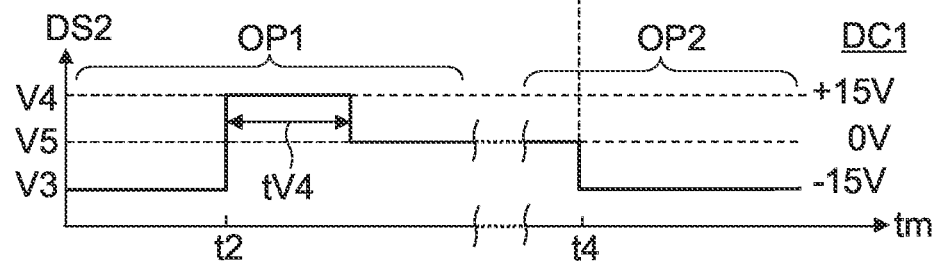

FIGS. 1A and 1B are schematic diagrams illustrating an operation of a drive device and a semiconductor module according to a first embodiment.

Figure 2:
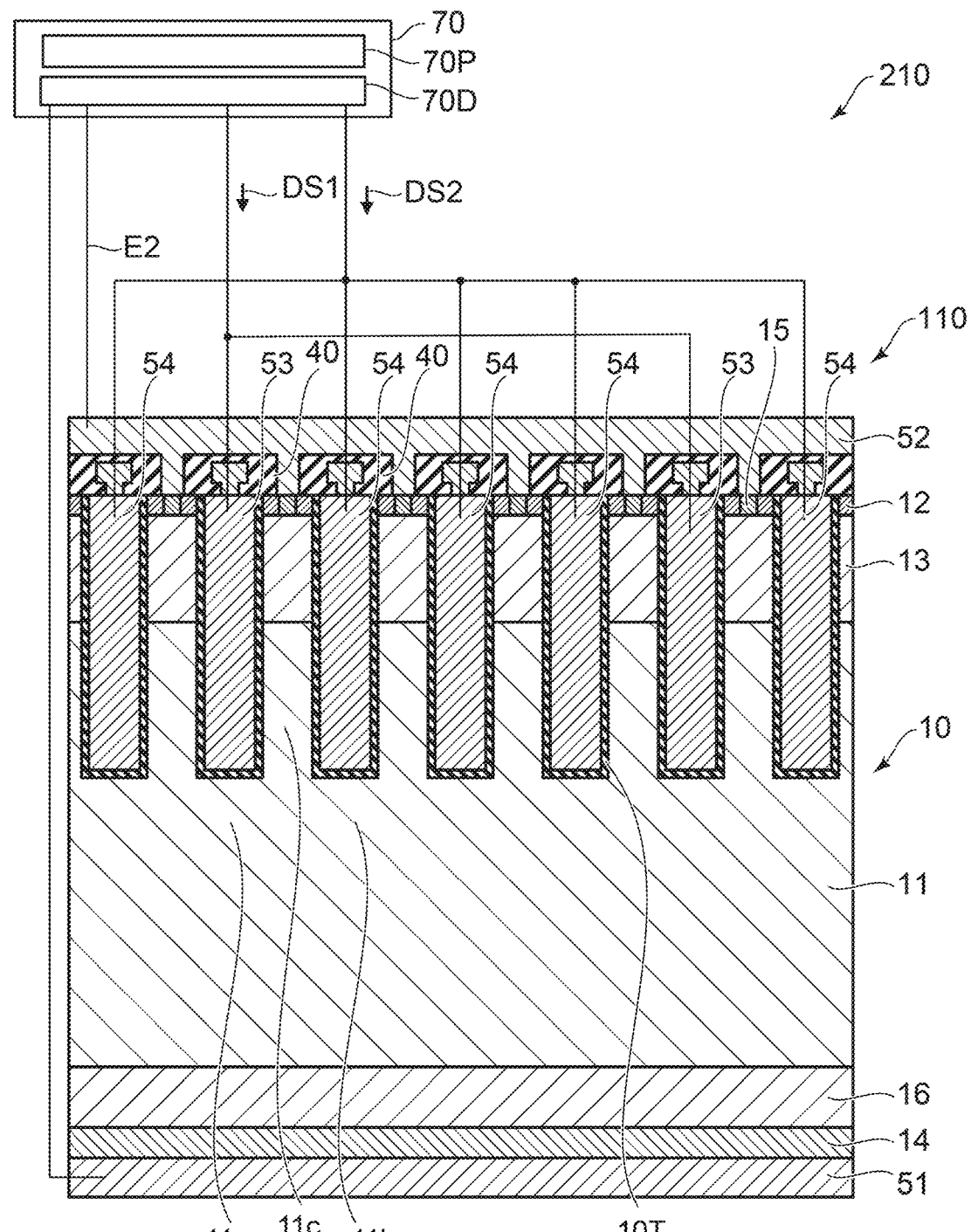
FIG. 2 is a schematic cross-sectional view illustrating a semiconductor device to which the drive device according to the first embodiment is applied.
Figure 2:
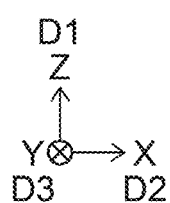

FIG. 2 is a schematic cross-sectional view illustrating the semiconductor device to which the drive device according to the first embodiment is applied.

As shown in FIG. 2, a drive device 70 according to the embodiment includes a drive circuit 70D. The drive circuit 70D is configured to drive a semiconductor device 110. The drive device 70 may include a power supply circuit 70P. The power supply circuit 70P supplies a voltage (and current) used for driving to the drive circuit 70D.

Hereinafter, an example of the semiconductor device 110 will be described.

As shown in FIG. 2, the semiconductor device 110 includes a first electrode 51, a second electrode 52, a third electrode 53, a fourth electrode 54, a semiconductor member 10, and an insulating member 40.

The semiconductor member 10 includes a first semiconductor region 11 of a first conductive type, a second semiconductor region 12 of the first conductive type, a third semiconductor region 13 of a second conductive type, and a fourth semiconductor region 14 of the second conductive type.

For example, the first conductive type is n-type and the second conductive type is p-type. In the embodiment, the first conductive type may be p-type and the second conductive type may be n-type. In the following, it is assumed that the first conductive type is n-type and the second conductive type is p-type.

The first semiconductor region 11 includes a first partial region 11a, a second partial region 11b, and a third partial region 11c. The first semiconductor region 11 is located between the first electrode 51 and the second semiconductor region 12 in a first direction D1. The boundary between the first partial region 11a and the third partial region 11c may be unclear. The boundary between the first partial region 11a and the second partial region 11b may be unclear. The boundary between the second partial region 11b and the third partial region 11c may be unclear. These partial regions are continuous with each other.

The first direction D1 is a Z-axis direction. One direction perpendicular to the Z-axis direction is defined as an X-axis direction. The direction perpendicular to the X-axis direction and the Z-axis direction is defined as a Y-axis direction.

The third semiconductor region 13 is located between the first semiconductor region 11 and the second semiconductor region 12 in the first direction D1. The fourth semiconductor region 14 is located between the first electrode 51 and the first semiconductor region 11 in the first direction D1.

The second electrode 52 is electrically connected to the second semiconductor region 12. The second electrode 52 may also be electrically connected to the third semiconductor region 13.

The first partial region 11a is located between the fourth semiconductor region 14 and the third electrode 53 in the first direction D1.

A second direction D2 from the third electrode 53 to the fourth electrode 54 crosses the first direction D1. The second direction D2 is, for example, the X-axis direction. The third electrode 53 and the fourth electrode 54 may extend along a third direction D3. The third direction D3 is, for example, the Y-axis direction.

The second partial region 11b is located between the fourth semiconductor region 14 and the fourth electrode 54 in the first direction D1. At least a portion of the third partial region 11c is located between the third electrode 53 and the fourth electrode 54 in the second direction D2. At least a part of the second semiconductor region 12 and at least a part of the third semiconductor region 13 are located between the third electrode 53 and the fourth electrode 54 in the second direction D2.

At least a part of the insulating member 40 is provided between the semiconductor member 10 and the third electrode 53, and between the semiconductor member 10 and the fourth electrode 54.

A current flowing between the first electrode 51 and the second electrode 52 can be controlled by a potential of the third electrode 53. The semiconductor device 110 is a transistor. The first electrode 51 functions as, for example, a collector electrode. The second electrode 52 functions as an emitter electrode, for example. The third electrode 53 functions as, for example, a gate electrode. The potential of the third electrode 53 may be, for example, a potential with reference to the potential of the first electrode 51. The semiconductor device 110 is, for example, an IGBT (Insulated Gate Bipolar Transistor). The fourth electrode 54 functions as a control gate electrode. The characteristics of the semiconductor device 110 can be controlled by controlling a potential of the fourth electrode 54.

For example, the fourth semiconductor region 14, the first semiconductor region 11, the third semiconductor region 13, and the second semiconductor region 12 are provided on the first electrode 51 in this order. In this example, the second electrode 52 is provided on the second semiconductor region 12. The third electrode 53 is provided in one of the plurality of trenches 10T provided in the semiconductor member 10. The fourth electrode 54 is provided in another one of the plurality of trenches 10T.

The first semiconductor region 11 is, for example, a drift layer. The first semiconductor region 11 is, for example, an $n^-$-layer. The second semiconductor region 12 is, for example, an emitter layer. The second semiconductor region 12 is, for example, an $n^+$-layer. The n-type (first conductive type) carrier concentration in the second semiconductor region 12 is higher than the n-type (first conductive type) carrier concentration in the first semiconductor region 11. The third semiconductor region 13 is, for example, a body layer. The third semiconductor region 13 is, for example, the p-layer.

As shown in FIG. 2, in this example, the semiconductor member 10 includes a fifth semiconductor region 15 of the second conductive type. The fifth semiconductor region 15 is located between the third semiconductor region 13 and the second electrode 52. The p-type (second conductive type) carrier concentration in the fifth semiconductor region 15 is higher than the p-type (second conductive type) carrier concentration in the third semiconductor region 13. The fifth semiconductor region 15 is, for example, a p-type contact layer. For example, the second electrode 52 is in contact with the fifth semiconductor region 15. The fifth semiconductor region 15 is provided as needed and may be omitted.

As shown in FIG. 2, in this example, the semiconductor member 10 includes the sixth semiconductor region 16. The sixth semiconductor region 16 is between the fourth semiconductor region 14 and the first semiconductor region 11. The sixth semiconductor region 16 is of the n-type (first conductive type). The carrier concentration of the n-type (first conductive type) in the sixth semiconductor region 16 is higher than the carrier concentration of the n-type (first conductive type) in the first semiconductor region 11. The sixth semiconductor region 16 is, for example, n-layer. The sixth semiconductor region 16 is, for example, a field stop layer. The sixth semiconductor region 16 is provided as needed and may be omitted.

The drive circuit 70D is configured to drive such a semiconductor device 110. As shown in FIG. 2, the drive circuit 70D is configured to supply a first drive signal DS1 to the third electrode 53. The drive circuit 70D is configured to supply a second drive signal DS2 to the fourth electrode 54.

The horizontal axis of FIGS. 1A and 1B is time tm. The vertical axis of FIG. 1A is the first drive signal DS1. The vertical axis of FIG. 1B is the second drive signal DS2.

As shown in FIGS. 1A and 1B, the drive circuit 70D is configured to perform a first operation OP1. The first operation OP1 is, for example, a turn-on operation. The drive circuit 70D is configured to perform a second operation OP2. The second operation OP2 is, for example, a turn-off operation. These operations may be repeated.

As shown in FIG. 1A, in the first operation OP1, the first drive signal DS1 changes from a first potential V1 to a second potential V2. The second potential V2 is higher than the first potential V1. In one example, the first potential V1 is −15V and the second potential V2 is +15V.

As shown in FIG. 1B, in the first operation OP1, the second drive signal DS2 changes from a third potential V3 to a fourth potential V4 and then changes to a fifth potential V5. The fourth potential V4 is higher than the third potential V3. The fifth potential V5 is between the third potential V3 and the fourth potential V4. In one example, the third potential V3 is −15V, the fourth potential V4 is +5V, and the fifth potential V5 is 0V.

It has been found that, for example, the turn-on loss Eon can be reduced in such an operation.

For example, there is a first reference example in which the second drive signal DS2 supplied to the fourth electrode 54 is the same as the first drive signal DS1 supplied to the third electrode 53. In the first reference example, the same drive signal is supplied to a plurality of gate electrodes.

On the other hand, in the embodiment, for example, a part of the plurality of gate electrodes corresponds to the third electrode 53, and another part of the plurality of gate electrodes corresponds to the fourth electrode 54. In the embodiment, the first drive signal DS1 supplied to the third electrode 53 is a two-level signal. On the other hand, the second drive signal DS2 supplied to the fourth electrode 54 has three levels. Experiments by the inventor have shown that the turn-on loss Eon in such an embodiment is 50% of the turn-on loss Eon in the first reference example above.

It is considered that the turn-on loss Eon is reduced by the third level of the second drive signal DS2 supplied to the fourth electrode 54 as follows. For example, as the number of electron injection channels increases, the current rises faster. Further, for example, the increase in electron injection channels increases the carrier accumulation rate. Thereby, the speed of the shrinkage of the depletion layer is increased. Thereby, the voltage falls faster. That is, the time change of the current becomes large, and the time change of the voltage also becomes large. The loss corresponds to the integral of current and voltage. The time change of the current becomes large, and the time change of the voltage also becomes large, so that the turn-on loss Eon becomes small.

In the embodiment, the turn-on loss Eon can be effectively reduced relatively easily by devising a power source that makes the second drive signal DS2 supplied to the fourth electrode 54 to be three-level signal.

For example, the drive device 70 may include a power supply circuit 70P (see FIG. 2). The power supply circuit 70P is configured to supply the voltage of the third potential V3, the voltage of the fourth potential V4, and the voltage of the fifth potential V5 to the drive circuit 70D. The drive circuit 70D is configured to generate the first drive signal DS1 and the second drive signal DS2 by switching these voltages.

In the embodiment, the first potential V1 may be substantially the same as the third potential V3. The second potential V2 may be substantially the same as the fourth potential V4. For example, a third electrode 53 and a fourth electrode 54 can be driven by a three-level potential.

These potentials may be potentials based on the potential of the second electrode 52 (second electrode potential E2, see FIG. 2). For example, the first potential V1 is lower than the second electrode potential E2. For example, the second potential V2 is higher than the second electrode potential E2. For example, the third potential V3 is lower than the second electrode potential E2. For example, the fourth potential V4 is higher than the second electrode potential E2. The second electrode potential E2 is, for example, a reference potential (0V).

The fifth potential V5 may be substantially the same as the second electrode potential E2. For example, the fifth potential V5 may be the central potential of the third potential V3 and the fourth potential V4. For example, the absolute value of the difference between the third potential V3 and the fifth potential V5 is not less than 0.3 times and not more than 0.7 times the absolute value of the difference between the third potential V3 and the fourth potential V4.

The time tV4 (see FIG. 1A) at which the second drive signal DS2 is the fourth potential V4 is preferably not less than 0.1 μs and not more than 10 μs, for example. When the time tV4 is 0.1 μs or more, for example, the loss can be stably suppressed. When the time tV4 is 10 μs or less, for example, an excessive time delay can be suppressed.

The time when the first drive signal DS1 changes from the first potential V1 to the second potential V2 is defined as the first time t1. The time when the second drive signal DS2 changes from the third potential V3 to the fourth potential V4 is defined as the second time t2. In the example of FIGS. 1A and 1B (first drive condition DC1), the second time t2 is substantially the same as the first time t1. As will be described later, the second time t2 may be different from the first time t1.

As described above, the drive circuit 70D is configured to perform the second operation OP2 (see FIGS. 1A and 1B). The second operation OP2 is, for example, the turn-off operation. In the second operation OP2, the first drive signal DS1 changes from the second potential V2 to the first potential V1. In the second operation OP2, the second drive signal DS2 changes from the fifth potential V5 to the third potential V3.

In the turn-off operation, the potential of the fourth electrode 54 may change before the change of the potential of the 3rd electrode 53. The time when the first drive signal DS1 changes from the second potential V2 to the first potential V1 is defined as the third time t3. The time when the second drive signal DS2 changes from the fifth potential V5 to the third potential V3 is defined as the fourth time t4. The third time t3 is after the fourth time 4.

A second reference example in which the fourth time t4 is the same as the third time t3 can be considered. From the inventor's experiments, it has been found that the turn-off loss Eoff when the third time t3 is after the fourth time t4 becomes 63% of the turn-off loss Eoff in the second reference example.

It is considered that the turn-off loss Eoff is reduced by the third time t3 being after the fourth time t4 as follows. By causing the voltage of the fourth electrode 54 (control gate electrode) to exceed the threshold value on the negative side, for example, a p-channel is formed and a hole is pulled out from the semiconductor member 10. By pulling out the holes from the semiconductor member 10, electron injection is reduced. That is, the conductivity is modulated. The turn-off is performed in a state where the total carrier amount in the semiconductor member 10 is reduced. As a result, the discharge of the carriers from the semiconductor member 10 is completed in a short time as compared with the case where the turn-off is performed with a large amount of carriers. This reduces the turn-off loss Eoff.

For example, when the number of the fourth electrodes 54 is large, the number of paths for pulling out carriers from the semiconductor member 10 increases. This increases the speed of the pulling out of carriers and the amount of the pulling out of carriers. This effectively reduces the turn-off loss Eoff.

An absolute value of a difference between the third time t3 and the fourth time t4 is defined as the off delay time $\Delta t2$. The off delay time $\Delta t2$ is preferably, for example, not less than 2 μs and not more than 10 μs. When the off delay time $\Delta t2$ is 2 μs or more, for example, the carrier amount in the semiconductor member 10 can be effectively reduced. For example, the turn-off loss Eoff can be effectively reduced. When the off delay time $\Delta t2$ is 10 μs or less, for example, it becomes easy to shorten the time for conduction loss being generated.

Figure 3A:
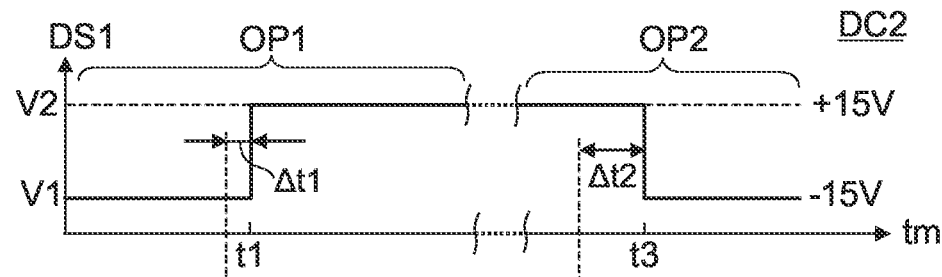
FIGS. 3A and 3B are schematic diagrams illustrating the operation of the drive device and the semiconductor module according to the first embodiment.
Figure 3B:
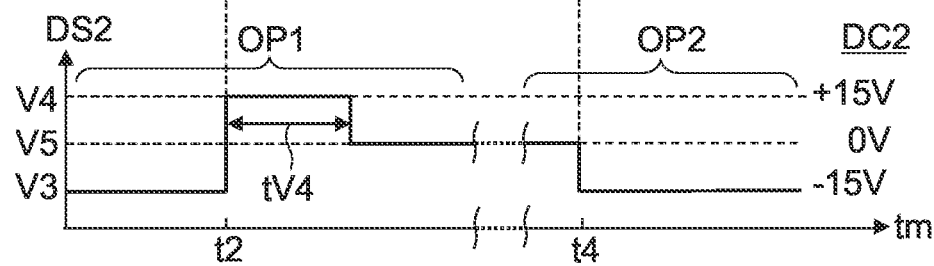

FIGS. 3A and 3B are schematic diagrams illustrating the operation of the drive device and the semiconductor module according to the first embodiment.

FIGS. 3A and 3B illustrate a second drive condition DC2. In the second drive condition DC2, the first time t1 is after the second time t2.

Figure 4A:
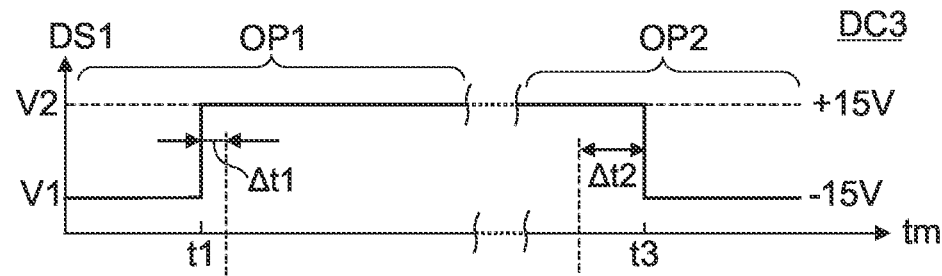
FIGS. 4A and 4B are schematic diagrams illustrating the operation of the drive device and the semiconductor module according to the first embodiment.
Figure 4B:
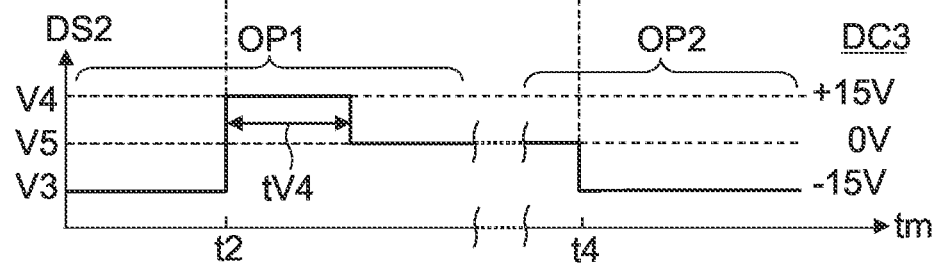

FIGS. 4A and 4B are schematic diagrams illustrating the operation of the drive device and the semiconductor module according to the first embodiment.

FIGS. 4A and 4B illustrate a third drive condition DC3. In the third drive condition DC3, the first time t1 is before the second time t2.

The above-mentioned first to third drive conditions DC1 to DC3 may be implemented according to the configuration of the semiconductor device. The configuration of the semiconductor device is, for example, the number (density) of the plurality of third electrodes 53 and the number (density) of the plurality of fourth electrodes 54 in the semiconductor device.

As shown in FIG. 2, the semiconductor device 110 includes a plurality of third electrodes 53 and a plurality of fourth electrodes 54. In the example of FIG. 2, the number of the plurality of fourth electrodes 54 is larger than the number of the plurality of third electrodes 53. The density of the plurality of fourth electrodes 54 is higher than the density of the plurality of third electrodes 53. In this case, the load of the plurality of fourth electrodes 54 is larger than the load of the plurality of third electrodes 53. In this case, it is preferable that the second drive condition DC2 (the first time t1 is after the second time t2) is applied. By starting the switching of the fourth electrode 54 having a large load first, it is easy to appropriately obtain the desired loss reduction effect.

For example, the short-circuit voltage when the number of the plurality of fourth electrodes 54 is larger than the number of the plurality of third electrodes 53 is higher than the short-circuit voltage when the number of the plurality of fourth electrodes 54 is smaller than the number of the plurality of third electrodes 53. From the viewpoint of the short-circuit voltage, it is preferable that the plurality of fourth electrodes 54 is larger than the plurality of third electrodes 53.

The absolute value of the difference between the first time t1 and the second time t2 is defined as the on delay time $\Delta t1$. In the second drive condition DC2, the on-delay time $\Delta t1$ (see FIGS. 3A and 3B) is preferably not less than 0.1 μs and not more than 10 μs. When the on-delay time $\Delta t1$ is 0.1 μs or more, for example, it is easy to stably suppress the loss. When the on-delay time $\Delta t1$ is 10 μs or less, for example, an excessive time delay can be suppressed.

Figure 5:
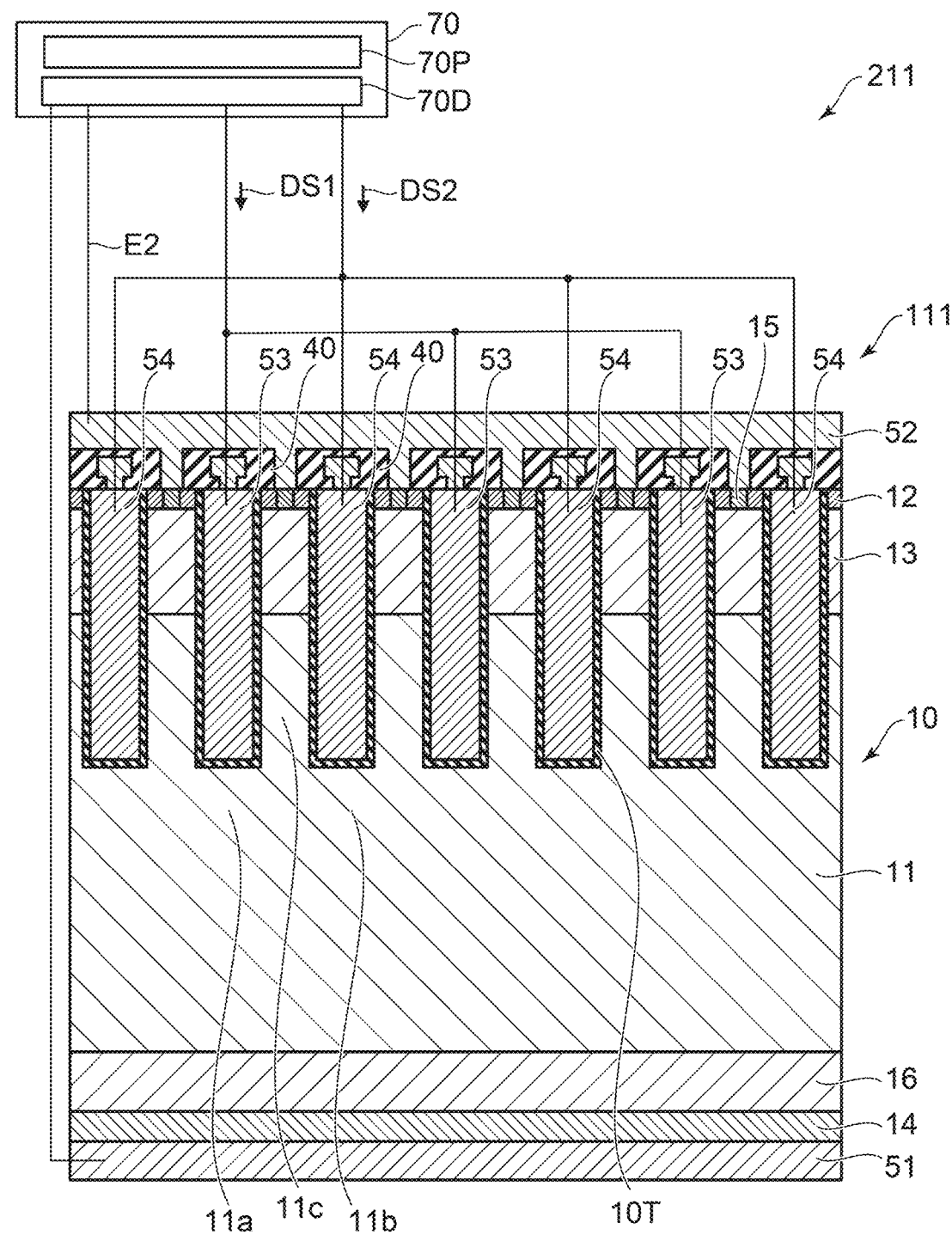
FIG. 5 is a schematic cross-sectional view illustrating a semiconductor device to which the drive device according to the first embodiment is applied.

FIG. 5 is a schematic cross-sectional view illustrating a semiconductor device to which the drive device according to the first embodiment is applied.

As shown in FIG. 5, in a semiconductor device 111 according to the embodiment, the number (density) of the plurality of fourth electrodes 54 is the same as the number (density) of the plurality of third electrodes 53. In this case, the load of the plurality of fourth electrodes 54 is larger than the load of the plurality of third electrodes 53. In this case, it is preferable that the first drive condition DC1 (the first time t1 is substantially the same as the second time t2) is applied. By simultaneously starting switching between the fourth electrode 54 and the third electrode 53 having the same load, it is easy to appropriately obtain the desired loss reduction effect. In the first drive condition DC1, the on delay time $\Delta t1$ is, for example, less than 0.1 μs.

Figure 6:
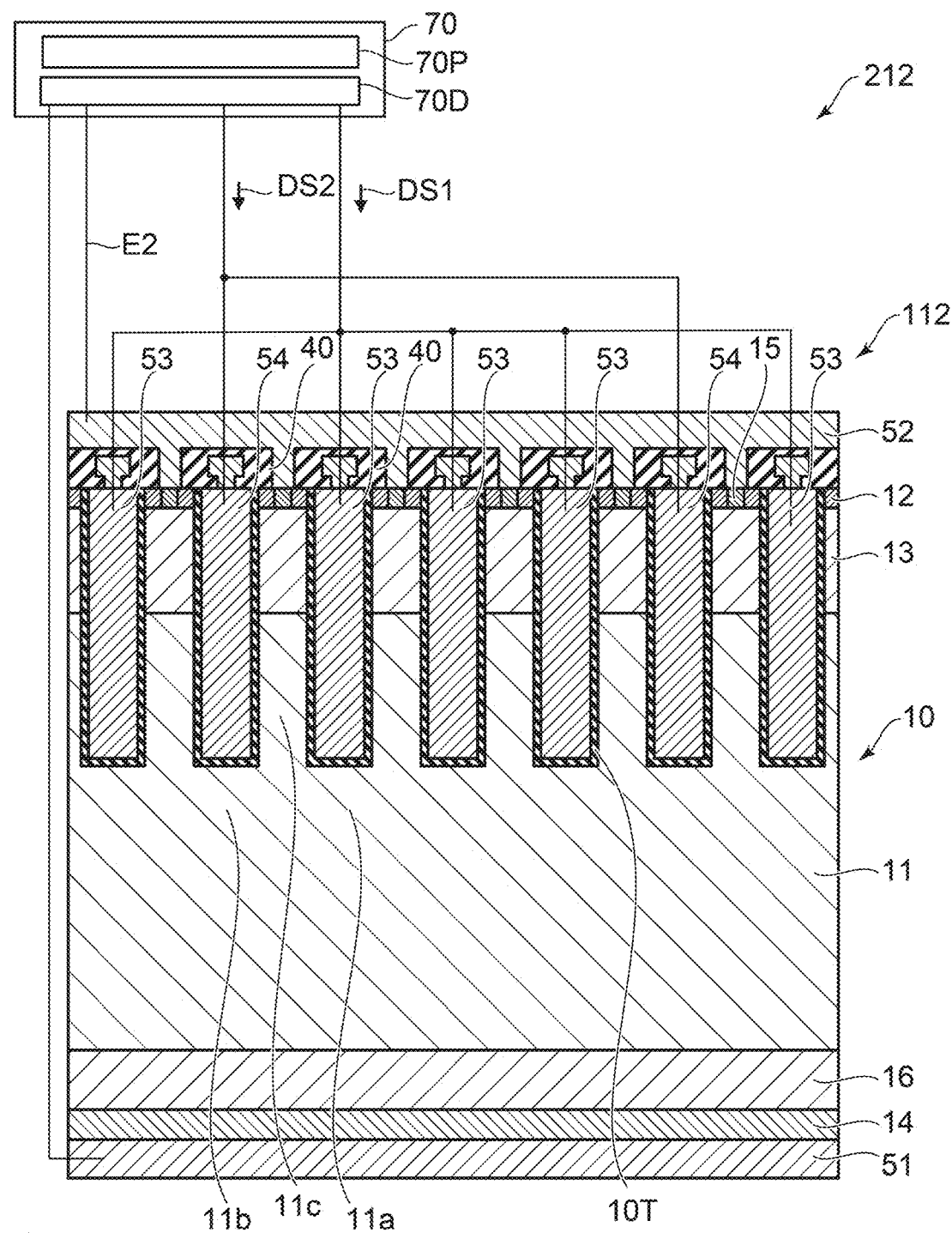
FIG. 6 is a schematic cross-sectional view illustrating a semiconductor device to which the drive device according to the first embodiment is applied.

FIG. 6 is a schematic cross-sectional view illustrating the semiconductor device to which the drive device according to the first embodiment is applied.

As shown in FIG. 6, in a semiconductor device 112 according to the embodiment, the number of the plurality of fourth electrodes 54 is smaller than the number of the plurality of third electrodes 53. The density of the plurality of fourth electrodes 54 is lower than the density of the plurality of third electrodes 53. In this case, the load of the plurality of fourth electrodes 54 is smaller than the load of the plurality of third electrodes 53. In this case, it is preferable that the third drive condition DC3 (the first time t1 is before the second time t2) is applied. By starting the switching of the third electrode 53 having a large load first, it is easy to appropriately obtain the desired loss reduction effect.

Under the third drive condition DC3, the on-delay time $\Delta t1$ (see FIGS. 4A and 4B) is preferably not less than 0.1 μs and not more than 10 μs. When the on-delay time $\Delta t1$ is 0.1 μs or more, for example, the loss can be stably suppressed. When the on-delay time $\Delta t1$ is 10 μs or less, for example, an excessive time delay can be suppressed.

As shown in FIGS. 2, 5 and 6, semiconductor modules 210 to 212 include the semiconductor devices 110 to 112, respectively. In the semiconductor module or semiconductor device according to the embodiment, a resistor described below may be provided.

Figure 7:
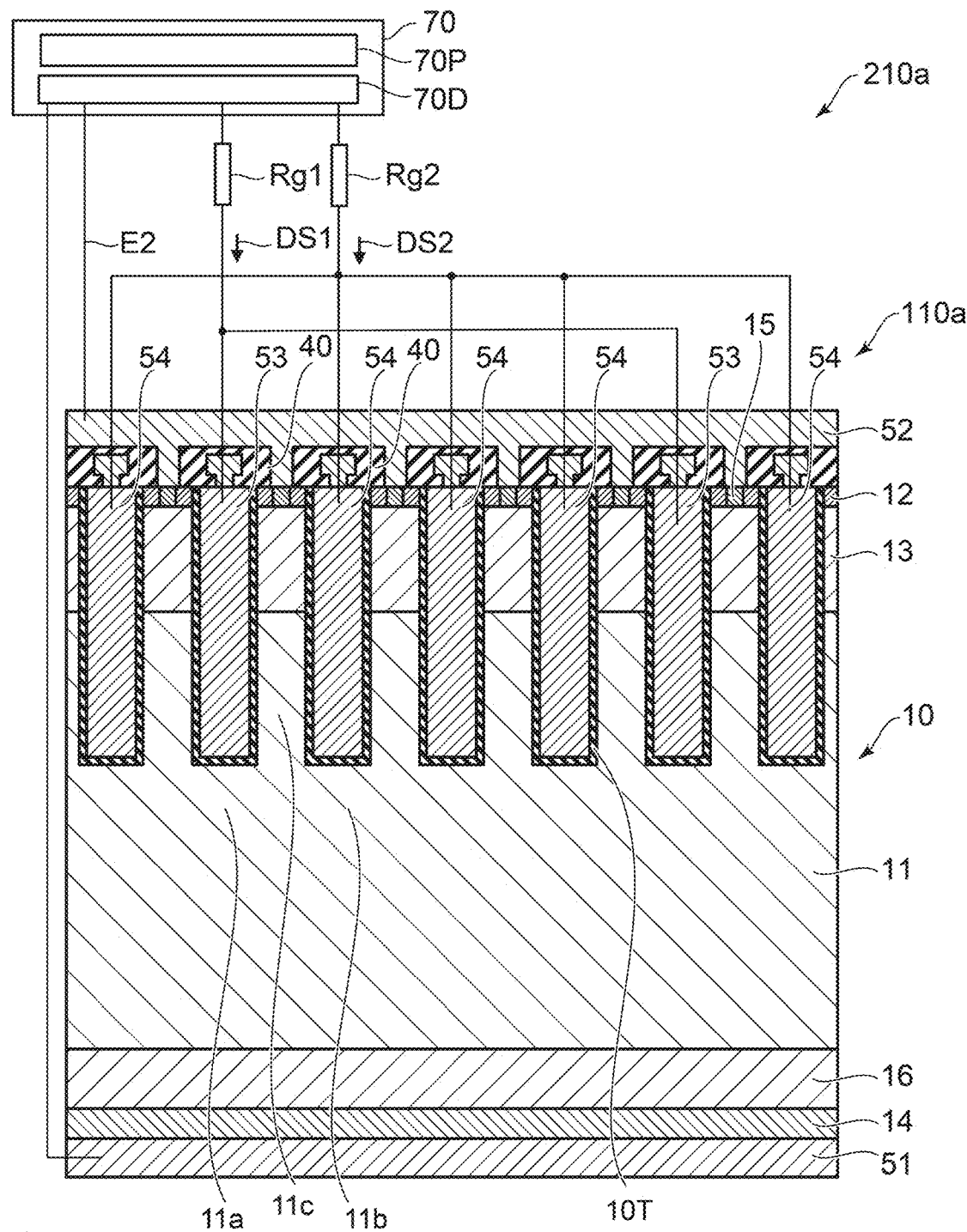
FIG. 7 is a schematic cross-sectional view illustrating the drive device, the semiconductor device, and the semiconductor module according to the first embodiment.
Figure 8:
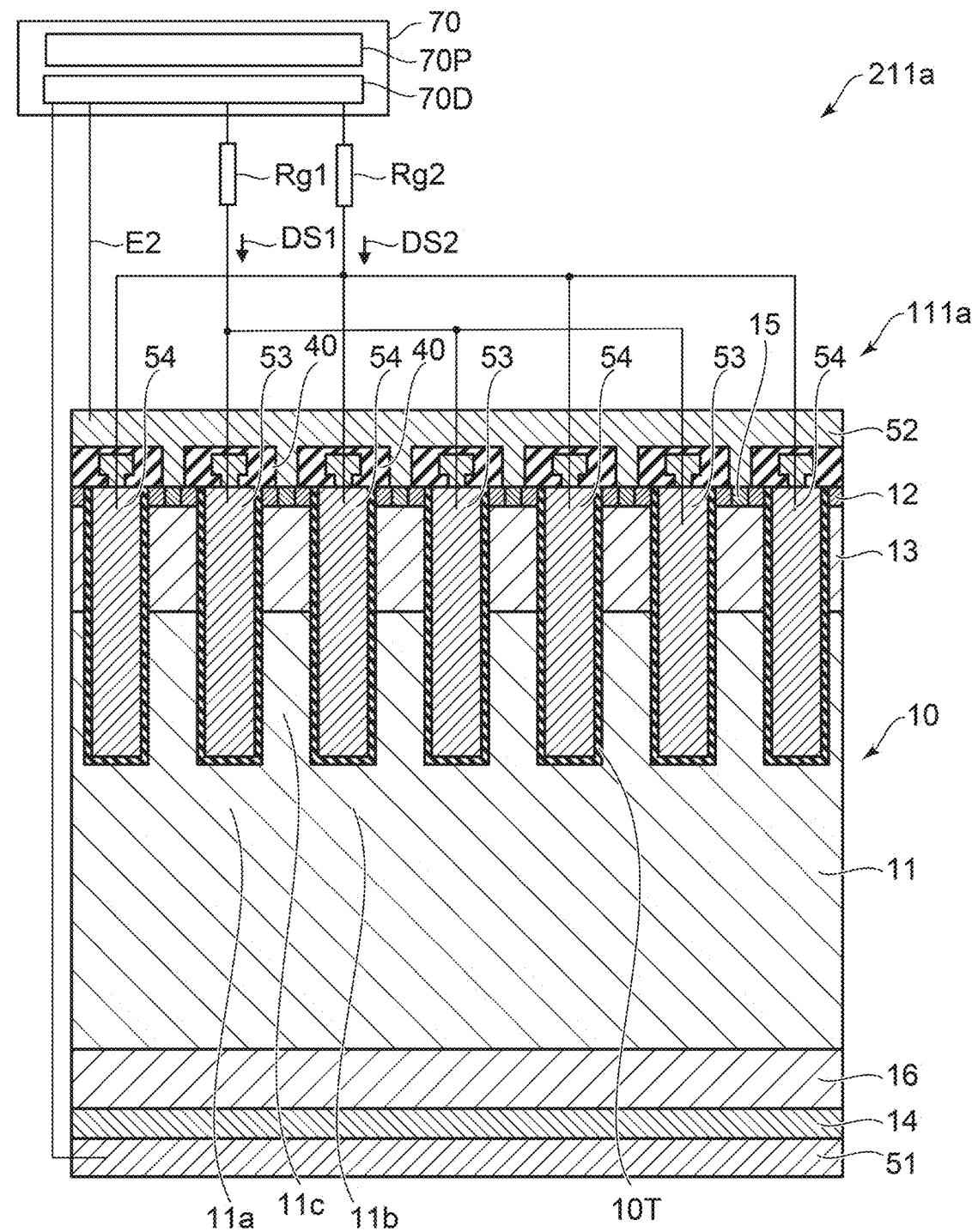
FIG. 8 is a schematic cross-sectional view illustrating the drive device, the semiconductor device, and the semiconductor module according to the first embodiment.
Figure 9:
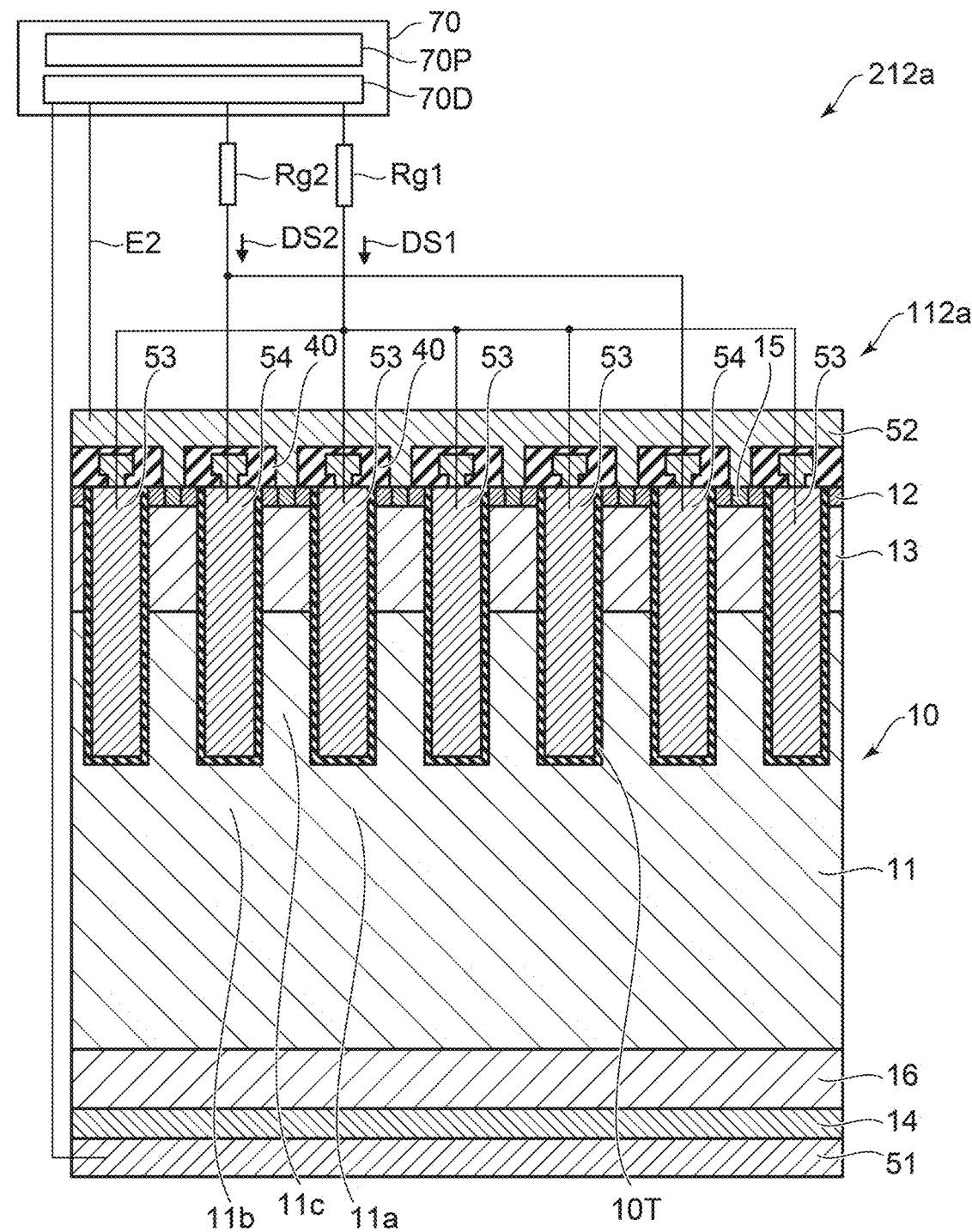
FIG. 9 is a schematic cross-sectional view illustrating the drive device, the semiconductor device, and the semiconductor module according to the first embodiment.

FIGS. 7 to 9 are schematic cross-sectional views illustrating a drive device, a semiconductor device, and a semiconductor module according to the first embodiment.

As shown in FIGS. 7 to 9, at least one of the first resistance Rg1 (resistor) and the second resistance Rg2 (resistor) may be provided in semiconductor modules 210a to 212a according to the embodiment. The first resistance Rg1 is provided in the current path between the drive circuit 70D and the third electrode 53. For example, the first resistance Rg1 is provided in series with the third electrode 53. The second resistance Rg2 is provided in the current path between the drive circuit 70D and the fourth electrode 54. For example, the second resistance Rg2 is provided in series with the fourth electrode 54. Except for these resistances, the configurations of the semiconductor modules 210a to 212a may be the same as the configurations of the semiconductor modules 210 to 212.

At least one of the first resistance Rg1 or the second resistance Rg2 may be included in the drive device 70. At least one of the first resistance Rg1 or the second resistance Rg2 may be provided in the semiconductor device. For example, the semiconductor devices 110a to 112a may include at least one of the first resistance Rg1 or the second resistance Rg2. These resistances may include, for example, at least one of semiconductors or metals. These resistances (resistors) may be provided, for example, in the terminal region of the semiconductor devices 110a to 112a.

By providing at least one of the first resistance Rg1 or the second resistance Rg2, the time constant of the change in the potential of the third electrode 53 can be made different from the time constant of the change in the potential of the fourth electrode 54. By making the time constant different between the third electrode 53 and the fourth electrode 54, for example, the time when the current starts to flow (for example, the delay time) can be adjusted. For example, the time when the current starts to flow (for example, the delay time) can be matched or brought close to each other. There is a case in which the gate capacitance Cge differs between the third electrode 53 and the fourth electrode 54. As a result, the delay times may not match. By adjusting the resistances, the delay times can be matched or brought closer.

Figure 10A:
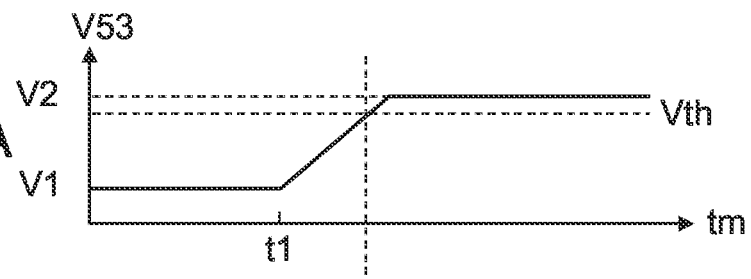
FIGS. 10A and 10B are schematic diagrams illustrating the operation of the drive device and the semiconductor module according to the embodiment.
Figure 10B:
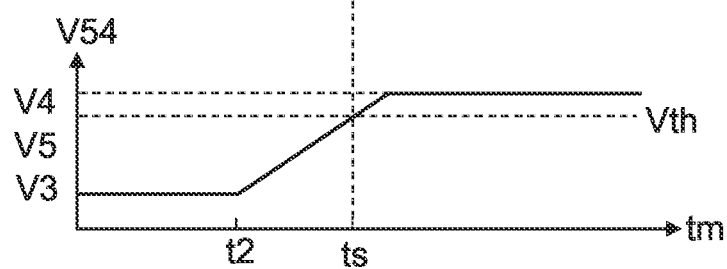

FIGS. 10A and 10B are schematic diagrams illustrating the operation of the drive device and the semiconductor module according to the embodiment.

These figures illustrate the change in voltage during the turn-on operation (first operation OP1). The horizontal axis of these figures is time tm. The vertical axis of FIG. 10A is the potential V53 of the third electrode 53. The vertical axis of FIG. 10B is the potential V54 of the fourth electrode 54. In this example, the first time t1 is after the second time t2. In this case, the first resistance Rg1 is set lower than the second resistance Rg2. Alternatively, the first resistance Rg1 is not provided. As a result, the potential V53 changes more steeply than the potential V54. As a result, the time when the potential V53 reaches the threshold value (time ts) can be the same as the time when the potential V54 reaches the threshold value (time ts). The timing at which the current starts to flow in the region corresponding to the third electrode 53 can be substantially matched with the timing at which the current starts to flow in the region corresponding to the fourth electrode 54. Thereby, the loss can be suppressed more effectively.

Figure 11A:
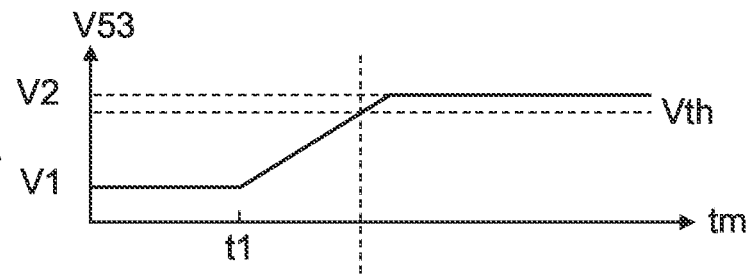
FIGS. 11A and 11B are schematic diagrams illustrating the operation of the drive device and the semiconductor module according to the embodiment.
Figure 11B:
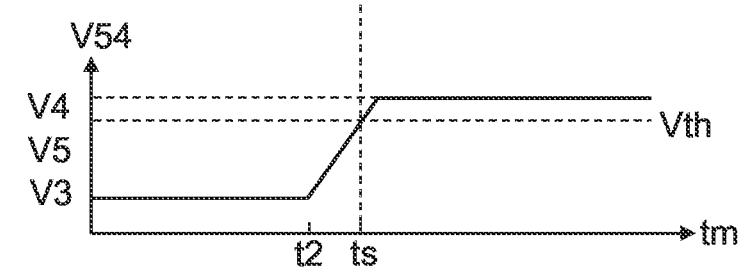

FIGS. 11A and 11B are schematic diagrams illustrating the operation of the drive device and the semiconductor module according to the embodiment.

These figures illustrate the change in voltage during the turn-on operation (first operation OP1). In this example, the first time t1 is before the second time t2. In this case, the second resistance Rg2 is set lower than the first resistance Rg1. Alternatively, the second resistor Rg2 is not provided. As a result, the potential V54 changes more steeply than the potential V53. As a result, the time when the potential V53 reaches the threshold value (time ts) can be the same as the time when the potential V54 reaches the threshold value (time ts). The timing at which the current starts to flow in the region corresponding to the third electrode 53 can be substantially matched with the timing at which the current starts to flow in the region corresponding to the fourth electrode 54. Thereby, the loss can be suppressed more effectively.

As described above, when the first time t1 is after the second time t2 (see FIGS. 10A and 10B), for example, the semiconductor device according to the embodiment includes a second resistor having a second resistance Rg2. In this case, the first resistor having the first resistance Rg1 is not provided. Alternatively, the first resistance Rg1 of the first resistor is lower than the second resistance Rg2 of the second resistor. "Rg1" represents the first resistor and/or the first resistance of the first resistor. "Rg2" represents the second resistor and/or the second resistance of the second resistor.

When the first time t1 is after the second time t2, for example, the drive circuit 70D includes the second resistance Rg2. In this case, the first resistance Rg1 is not provided. Alternatively, the first resistance Rg1 is lower than the second resistance Rg2.

On the other hand, when the first time t1 is before the second time t2 (see FIGS. 11A and 11B), for example, the semiconductor device according to the embodiment includes the first resistance Rg1. In this case, the second resistor Rg2 is not provided. Alternatively, the second resistance Rg2 is lower than the first resistance Rg1.

When the first time t1 is before the second time t2, for example, the drive circuit 70D includes the first resistance Rg1. In this case, the second resistor Rg2 is not provided. Alternatively, the second resistance Rg2 is lower than the first resistance Rg1.

With the above configuration, the loss can be suppressed more effectively. At least one of the first resistance Rg1 (resistor) or the second resistance Rg2 (resistor) may be a variable resistance. For example, as at least one of the first resistance Rg1 or the second resistance Rg2, a resistance element including a plurality of resistors may be applied. The resistance can be changed by changing the connection of multiple resistors. For example, at least one of the first resistance Rg1 or the second resistance Rg2 may be changed based on a monitoring result by monitoring the characteristics of the semiconductor device.

When a plurality of third electrodes 53 and a plurality of fourth electrodes 54 are provided, the number of the plurality of third electrodes 53 may not be the same as the number of the plurality of fourth electrodes 54. As a result, the gate capacitance of the plurality of third electrodes 53 does not match the gate capacitance of the plurality of fourth electrodes 54. Due to this, the delay times may not match and the loss may increase. In such a case, the first resistance Rg1 and the second resistance Rg2 that are different from each other may be provided. For example, when the number of the plurality of third electrodes 53 is larger than the number of the plurality of fourth electrodes 54, the second resistance Rg2 is provided and the first resistance Rg1 is not provided, or the first resistance Rg1 is set lower than the second resistance Rg2. For example, when the number of the plurality of third electrodes 53 is smaller than the number of the plurality of fourth electrodes 54, the first resistance Rg1 is provided and the second resistance Rg2 is not provided, or the second resistance Rg2 is set lower than the first resistance Rg1. As a result, the delay time becomes the same and the loss can be suppressed.

Figure 12:
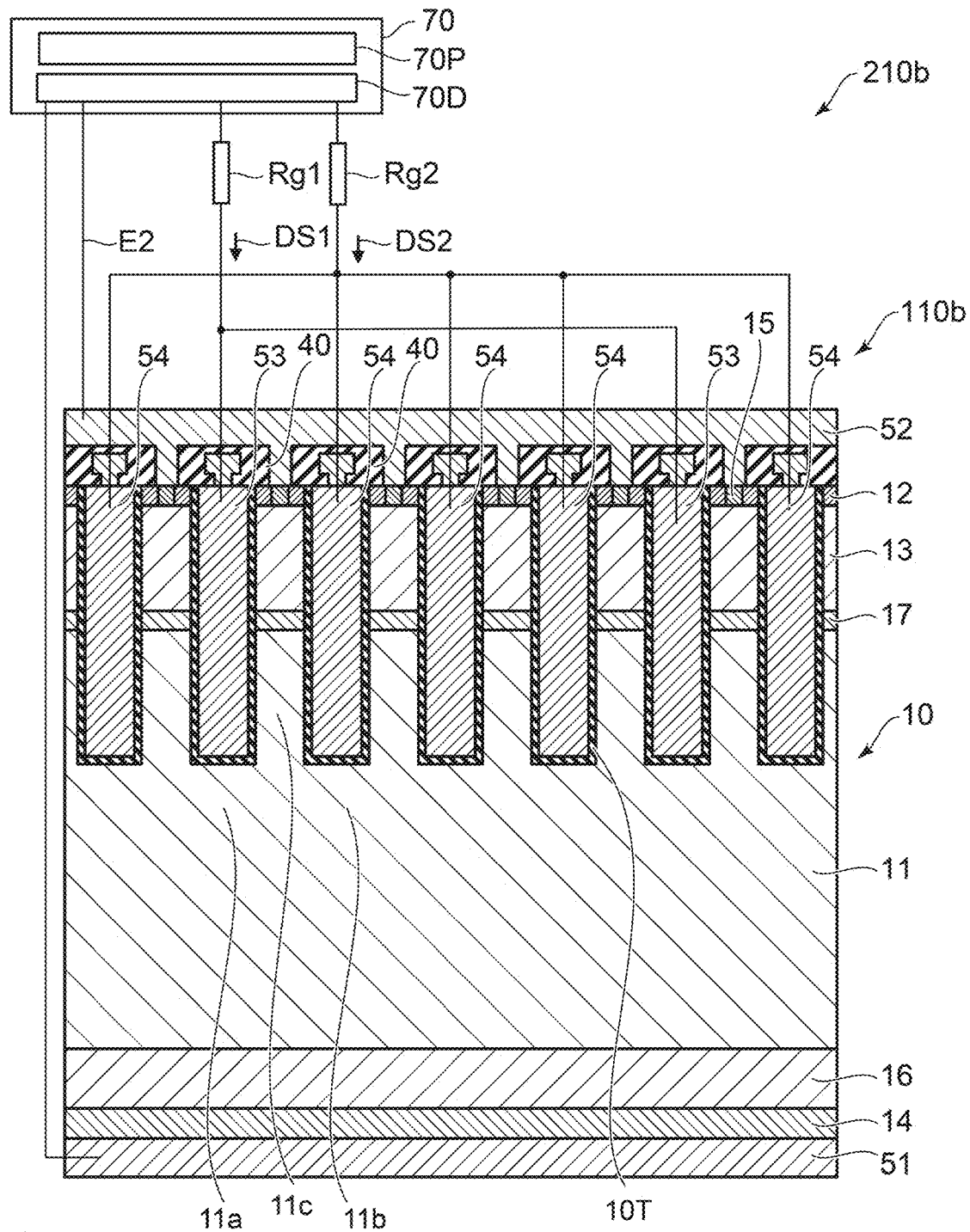
FIG. 12 is a schematic cross-sectional view illustrating the drive device, the semiconductor device, and the semiconductor module according to the first embodiment.
Figure 13:
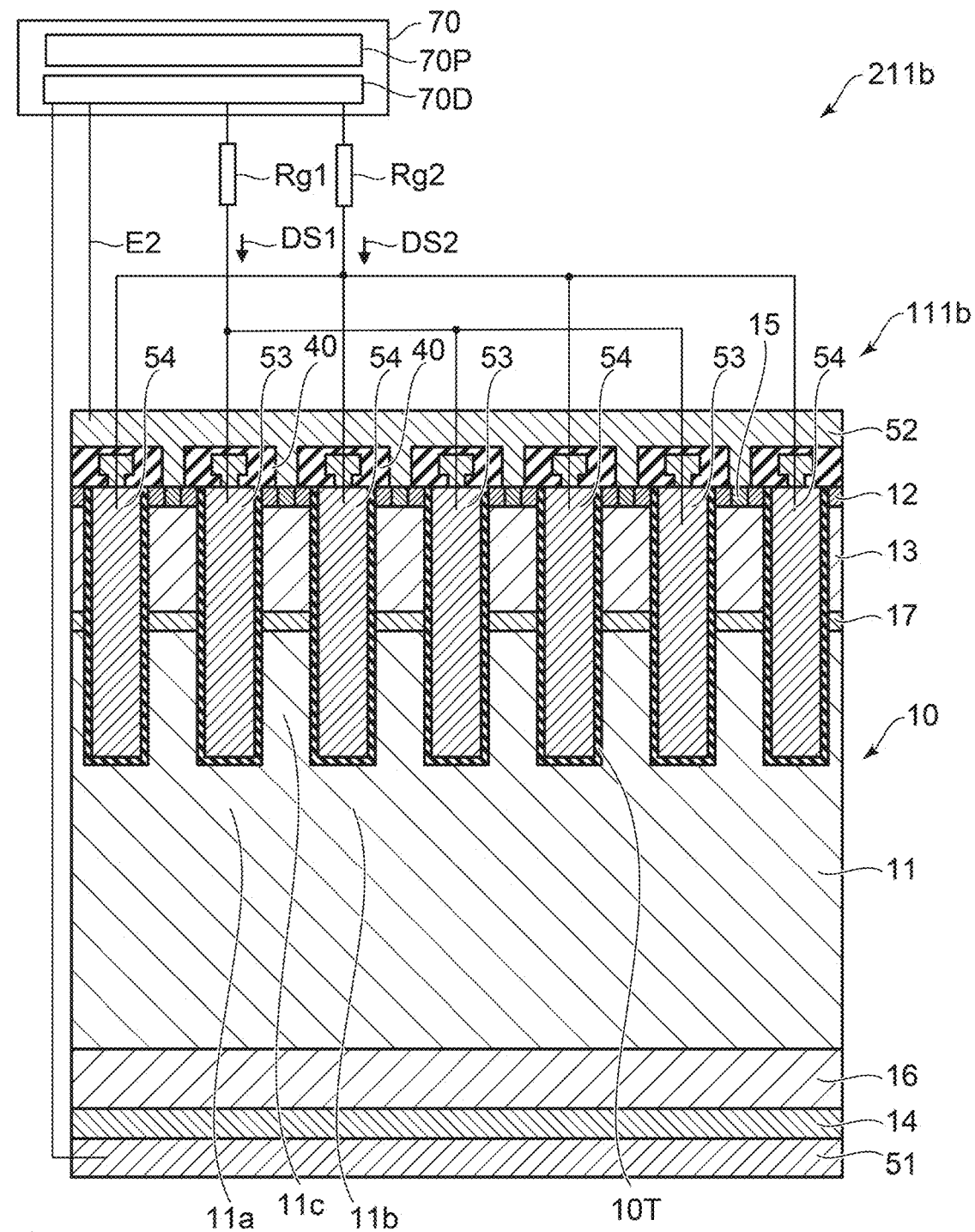
FIG. 13 is a schematic cross-sectional view illustrating the drive device, the semiconductor device, and the semiconductor module according to the first embodiment.
Figure 14:
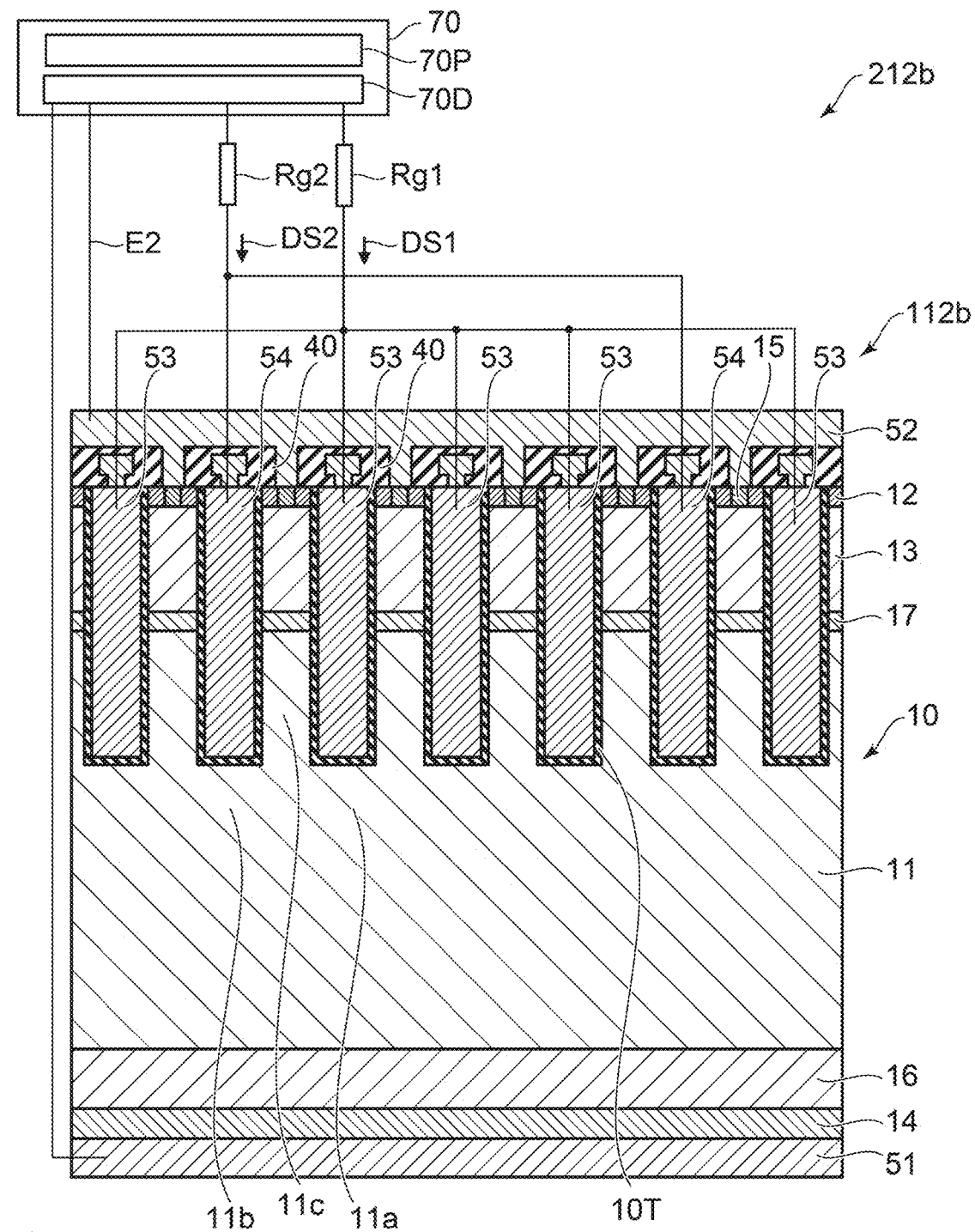
FIG. 14 is a schematic cross-sectional view illustrating the drive device, the semiconductor device, and the semiconductor module according to the first embodiment.

FIGS. 12 to 14 are schematic cross-sectional views illustrating the drive device, the semiconductor device, and the semiconductor module according to the first embodiment.

As shown in FIGS. 12 to 14, in the semiconductor devices 110b to 112b according to the embodiment, the semiconductor member 10 may include the seventh semiconductor region 17 of the first conductive type (for example, n-type). Except for this, the configurations of the semiconductor devices 110b to 112b may be the same as those of the semiconductor devices 110 to 112 or 110a to 112a.

The seventh semiconductor region 17 is provided between the first semiconductor region 11 and the third semiconductor region 13. For example, the carrier concentration of the first conductive type in the seventh semiconductor region 17 is higher than the carrier concentration of the first conductive type in the first semiconductor region 11. The carrier concentration of the first conductive type in the seventh semiconductor region 17 may be lower than the carrier concentration of the first conductive type in the second semiconductor region 12. The seventh semiconductor region 17 is, for example, an n-type barrier layer. By providing the seventh semiconductor region 17, for example, in the on state (steady state), carrier accumulation in the first semiconductor region 11 is promoted. For example, lower on-resistance is obtained.

Second Embodiment

The second embodiment relates to semiconductor modules (for example, semiconductor modules 210 to 212 and 210a to 212a). The semiconductor module according to the embodiment includes the drive device 70 according to the first embodiment and the above-mentioned semiconductor device (for example, the semiconductor devices 110 to 112, or 110a to 112a, etc.). In the semiconductor module according to the embodiment, loss can be suppressed.

In the embodiment, the semiconductor member 10 includes, for example, silicon. The semiconductor member 10 may include SiC, gallium nitride, gallium oxide, diamond, or the like. The first electrode 51 includes, for example, aluminum or the like. The second electrode 52 includes, for example, aluminum. The third electrode 53 and the fourth electrode 54 include, for example, conductive silicon and the like. The insulating member 40 includes, for example, silicon and at least one selected from the group consisting of oxygen and nitrogen.

In the embodiment, information regarding the shape of the semiconductor region and the like can be obtained, for example, by observation with an electron microscope. Information on the impurity concentration in the semiconductor region can be obtained by, for example, EDX (Energy Dispersive X-ray Spectroscopy) or SIMS (Secondary Ion Mass Spectrometry). Information on the carrier concentration in the semiconductor region can be obtained by, for example, SCM (Scanning Capacitance Microscopy).

The embodiments may include the following configurations (for example, technical proposals).
(Configuration 1)
A drive device, comprising:
a drive circuit configured to drive a semiconductor device, the semiconductor device including
a first electrode,
a semiconductor member including
a first semiconductor region of a first conductive type,
a second semiconductor region of the first conductive type,
a third semiconductor region of a second conductive type, and
a fourth semiconductor region of the second conductive type,
the first semiconductor region including a first partial region, a second partial region, and a third partial region,
the first semiconductor region being located between the first electrode and the second semiconductor region in a first direction,
the third semiconductor region being located between the first semiconductor region and the second semiconductor region in the first direction,
the fourth semiconductor region being located between the first electrode and the first semiconductor region in the first direction;
a second electrode electrically connected to the second semiconductor region,
a third electrode, the first partial region being located between the fourth semiconductor region and the third electrode in the first direction,
a fourth electrode, a second direction from the third electrode to the fourth electrode crossing the first direction, the second partial region being located between the fourth semiconductor region and the fourth electrode in the first direction, at least a part of the third partial region being located between the third electrode and the fourth electrode, at least a part of the second semiconductor region and at least a part of the third semiconductor region being located between the third electrode and the fourth electrode in the second direction, and
an insulating member, at least a part of the insulating member being provided between the semiconductor member and the third electrode, and between the semiconductor member and the fourth electrode,
the drive circuit being configured to supply a first drive signal to the third electrode and to supply a second drive signal to the fourth electrode,
in a first operation, the first drive signal being configured to change from a first potential to a second potential higher than the first potential, and
in the first operation, the second drive signal being configured to change from a third potential to a fourth potential higher than the third potential, and to change to a fifth potential between the third potential and the fourth potential after the changing from the third potential to the fourth potential.
(Configuration 2)
A drive device, comprising:
a drive circuit configured to drive a semiconductor device, the semiconductor device including a first electrode configured to function as a collector electrode, a second electrode configured to function as an emitter electrode, a third electrode to configured to function as a gate electrode, and a fourth electrode configured to function as a control gate electrode,
the drive circuit being configured to supply a first drive signal to the third electrode and to supply a second drive signal to the fourth electrode,
in a first operation, the first drive signal being configured to change from a first potential to a second potential higher than the first potential, and
in the first operation, the second drive signal being configured to change from a third potential to a fourth potential higher than the third potential, and to change to the fifth potential between the third potential and the fourth potential after the changing from the third potential to the fourth potential.
(Configuration 3)
The drive device according to Configuration 1 or 2, wherein a first time when the first drive signal changes from the first potential to the second potential is after a second time when the second drive signal changes from the third potential to the fourth potential.

(Configuration 4)
The drive device according to Configuration 3, wherein the semiconductor device includes a plurality of the third electrodes and a plurality of the fourth electrodes, and a number of the plurality of fourth electrodes is larger than a number of the plurality of third electrodes.

(Configuration 5)
The drive device according to Configuration 3 or 4, wherein an absolute value of a difference between the first time and the second time is not less than 0.1 μs and not more than 10 μs.

(Configuration 6)
The drive device according to any one of Configurations 3 to 5, wherein
the semiconductor device further includes a second resistor provided in a current path between the drive circuit and the fourth electrode, and
a first resistor is not provided in a current path between the drive circuit and the third electrode, or a first resistance of a first resistor provided in the current path between the drive circuit and the third electrode is lower than a second resistance of the second resistor.

(Configuration 7)
The drive device according to any one of Configurations 3 to 5, further comprising a second resistor provided in a current path between the drive circuit and the fourth electrode,
a first resistor being not provided in a current path between the drive circuit and the third electrode, or a first resistance of the first resistor provided in the current path between the drive circuit and the third electrode being lower than a second resistance of the second resistor.

(Configuration 8)
The drive device according to Configuration 1 or 2, wherein a first time when the first drive signal changes from the first potential to the second potential is before a second time when the second drive signal changes from the third potential to the fourth potential.

(Configuration 9)
The drive device according to Configuration 8, wherein the semiconductor device includes a plurality of the third electrodes and a plurality of the fourth electrodes, and a number of the plurality of fourth electrodes is smaller than a number of the plurality of third electrodes.

(Configuration 10)
The drive device according to Configuration 8 or 9, wherein the semiconductor device further includes a first resistor provided in a current path between the drive circuit and the third electrode, and
a second resistor is not provided in a current path between the drive circuit and the fourth electrode, or a second resistance of the second resistor provided in the current path between the drive circuit and the fourth electrode is lower than a first resistance of the first resistor.

(Configuration 11)
The drive device according to Configuration 8 or 9, further comprising a first resistor provided in a current path between the drive circuit and the third electrode,
a second resistor being not provided in a current path between the drive circuit and the fourth electrode, or a second resistance of the second resistor provided in the current path between the drive circuit and the fourth electrode being lower than a first resistance of the second resistor.

(Configuration 12)
The drive device according to any one of Configurations 1 to 11, wherein an absolute value of a difference between the third potential and the fifth potential is not less than 0.3 times and not more than 0.7 an absolute value of a difference between the third potential and the fourth potential.

(Configuration 13)
The drive device according to any one of Configurations 1 to 12, wherein
the first potential is lower than a second electrode potential of the second electrode, and
the second potential is higher than the second electrode potential.

(Configuration 14)
The drive device according to Configuration 13, wherein
the third potential is lower than the second electrode potential and
the fourth potential is higher than the second electrode potential.

(Configuration 15)
The drive device according to Configuration 13 or 14, wherein the fifth potential is substantially same as the second electrode potential.

(Configuration 16)
The drive device according to any one of Configurations 1 to 15, wherein
in a second operation, the first drive signal is configured to change from the second potential to the first potential, and
in the second operation, the second drive signal is configured to change from the fifth potential to the third potential.

(Configuration 17)
The drive device according to Configuration 16, wherein a third time when the first drive signal changes from the second potential to the first potential is after a fourth time when the second drive signal changes from the fifth potential to the third potential.

(Configuration 18)
The drive device according to any one of Configurations 1 to 17, wherein
the first potential is substantially same as the third potential, and
the second potential is substantially same as the fourth potential.

(Configuration 19)
The drive device according to any one of Configurations 1 to 18, wherein
the drive device further includes a power supply circuit, and
the power supply circuit is configured to supply a voltage of the third potential, a voltage of the fourth potential, and a voltage of the fifth potential to the drive circuit.

(Configuration 20)
A semiconductor module, comprising:
the drive device according to any one of configurations 1 to 19; and
the semiconductor device.

According to the embodiment, it is possible to provide a drive device and a semiconductor module capable of suppressing loss.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor modules such as a drive circuit, power supply circuit, semiconductor device, electrode, semiconductor member, insulation member, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and semiconductor modules practicable by an appropriate design modification by one skilled in the art based on the semiconductor devices and semiconductor modules described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A drive device, comprising:
   a drive circuit configured to drive a semiconductor device, the semiconductor device including
      a first electrode,
      a semiconductor member including
         a first semiconductor region of a first conductive type,
         a second semiconductor region of the first conductive type,
         a third semiconductor region of a second conductive type, and
         a fourth semiconductor region of the second conductive type,
      the first semiconductor region including a first partial region, a second partial region, and a third partial region,
      the first semiconductor region being located between the first electrode and the second semiconductor region in a first direction,
      the third semiconductor region being located between the first semiconductor region and the second semiconductor region in the first direction,
      the fourth semiconductor region being located between the first electrode and the first semiconductor region in the first direction;
   a second electrode electrically connected to the second semiconductor region,
   a third electrode, the first partial region being located between the fourth semiconductor region and the third electrode in the first direction,
   a fourth electrode, a second direction from the third electrode to the fourth electrode crossing the first direction, the second partial region being located between the fourth semiconductor region and the fourth electrode in the first direction, at least a part of the third partial region being located between the third electrode and the fourth electrode, at least a part of the second semiconductor region and at least a part of the third semiconductor region being located between the third electrode and the fourth electrode in the second direction, and
   an insulating member, at least a part of the insulating member being provided between the semiconductor member and the third electrode, and between the semiconductor member and the fourth electrode,
   the drive circuit being configured to supply a first drive signal to the third electrode and to supply a second drive signal to the fourth electrode,
   in a first operation, the first drive signal being configured to change from a first potential to a second potential higher than the first potential, and
   in the first operation, the second drive signal being configured to change from a third potential to a fourth potential higher than the third potential, and to change to a fifth potential between the third potential and the fourth potential after the changing from the third potential to the fourth potential,
   wherein an absolute value of a difference between the third potential and the fifth potential is not less than 0.3 times and not more than 0.7 an absolute value of a difference between the third potential and the fourth potential.

2. The device according to claim 1, wherein a first time when the first drive signal changes from the first potential to the second potential is after a second time when the second drive signal changes from the third potential to the fourth potential.

3. The device according to claim 2, wherein
   the semiconductor device includes a plurality of the third electrodes and a plurality of the fourth electrodes, and
   a number of the plurality of fourth electrodes is larger than a number of the plurality of third electrodes.

4. The device according to claim 2, wherein an absolute value of a difference between the first time and the second time is not less than 0.1 μs and not more than 10 μs.

5. The device according to claim 2, wherein
   the semiconductor device further includes a second resistor provided in a current path between the drive circuit and the fourth electrode, and
   a first resistor is not provided in a current path between the drive circuit and the third electrode, or a first resistance of the first resistor provided in the current path between the drive circuit and the third electrode is lower than a second resistance of the second resistor.

6. The device according to claim 2, further comprising a second resistor provided in a current path between the drive circuit and the fourth electrode,
   a first resistor being not provided in a current path between the drive circuit and the third electrode, or a first resistance of the first resistor provided in the current path between the drive circuit and the third electrode being lower than a second resistance of the second resistor.

7. The device according to claim 1, wherein a first time when the first drive signal changes from the first potential to the second potential is before a second time when the second drive signal changes from the third potential to the fourth potential.

8. The device according to claim 7, wherein
   the semiconductor device includes a plurality of the third electrodes and a plurality of the fourth electrodes, and a number of the plurality of fourth electrodes is smaller than a number of the plurality of third electrodes.

9. The device according to claim 7, wherein
the semiconductor device further includes a first resistor provided in a current path between the drive circuit and the third electrode, and
a second resistor is not provided in a current path between the drive circuit and the fourth electrode, or a second resistance of the second resistor provided in the current path between the drive circuit and the fourth electrode is lower than a first resistance of the first resistor.

10. The device according to claim 7, further comprising a first resistor provided in a current path between the drive circuit and the third electrode,
a second resistor being not provided in a current path between the drive circuit and the fourth electrode, or a second resistance of the second resistor provided in the current path between the drive circuit and the fourth electrode being lower than a first resistance of the second resistor.

11. The device according to claim 1, wherein
the first potential is lower than a second electrode potential of the second electrode, and
the second potential is higher than the second electrode potential.

12. The device according to claim 11, wherein
the third potential is lower than the second electrode potential and
the fourth potential is higher than the second electrode potential.

13. The device according to claim 11, wherein the fifth potential is substantially same as the second electrode potential.

14. The device according to claim 1, wherein
in a second operation, the first drive signal is configured to change from the second potential to the first potential, and
in the second operation, the second drive signal is configured to change from the fifth potential to the third potential.

15. The device according to claim 14, wherein a third time when the first drive signal changes from the second potential to the first potential is after a fourth time when the second drive signal changes from the fifth potential to the third potential.

16. The device according to claim 1, wherein
the first potential is substantially same as the third potential, and
the second potential is substantially same as the fourth potential.

17. The device according to claim 1, wherein
the drive device further includes a power supply circuit, and
the power supply circuit is configured to supply a voltage of the third potential, a voltage of the fourth potential, and a voltage of the fifth potential to the drive circuit.

18. A semiconductor module, comprising:
the drive device according to claim 1; and
the semiconductor device.

19. A drive device, comprising:
a drive circuit configured to drive a semiconductor device, the semiconductor device including
a first electrode,
a semiconductor member including a first semiconductor region of a first conductive type,
a second semiconductor region of the first conductive type,
a third semiconductor region of a second conductive type, and
a fourth semiconductor region of the second conductive type,
the first semiconductor region including a first partial region, a second partial region, and a third partial region,
the first semiconductor region being located between the first electrode and the second semiconductor region in a first direction,
the third semiconductor region being located between the first semiconductor region and the second semiconductor region in the first direction,
the fourth semiconductor region being located between the first electrode and the first semiconductor region in the first direction;
a second electrode electrically connected to the second semiconductor region,
a third electrode, the first partial region being located between the fourth semiconductor region and the third electrode in the first direction,
a fourth electrode, a second direction from the third electrode to the fourth electrode crossing the first direction, the second partial region being located between the fourth semiconductor region and the fourth electrode in the first direction, at least a part of the third partial region being located between the third electrode and the fourth electrode, at least a part of the second semiconductor region and at least a part of the third semiconductor region being located between the third electrode and the fourth electrode in the second direction, and
an insulating member, at least a part of the insulating member being provided between the semiconductor member and the third electrode, and between the semiconductor member and the fourth electrode,
the drive circuit being configured to supply a first drive signal to the third electrode and to supply a second drive signal to the fourth electrode,
in a first operation, the first drive signal being configured to change from a first potential to a second potential higher than the first potential, and
in the first operation, the second drive signal being configured to change from a third potential to a fourth potential higher than the third potential, and to change to a fifth potential between the third potential and the fourth potential after the changing from the third potential to the fourth potential,
wherein
in a second operation, the first drive signal is configured to change from the second potential to the first potential, and
in the second operation, the second drive signal is configured to change from the fifth potential to the third potential.

20. The device according to claim 14, wherein a third time when the first drive signal changes from the second potential to the first potential is after a fourth time when the second drive signal changes from the fifth potential to the third potential.

* * * * *